United States Patent
Wang et al.

(10) Patent No.: US 10,425,124 B1
(45) Date of Patent: Sep. 24, 2019

(54) REPEATERS WITH FAST TRANSITIONS FROM LOW-POWER STANDBY TO LOW-FREQUENCY SIGNAL TRANSMISSION

(71) Applicant: Pericom Semiconductor Corporation, Milpitas, CA (US)

(72) Inventors: Jin-sheng Wang, Cupertino, CA (US); Kwok Wing Choy, Sunnyvale, CA (US); Kai Hung Yu, San Jose, CA (US)

(73) Assignee: Pericom Semiconductor Corporation, Milpitas, CA (US)

( * ) Notice: Subject to any disclaimer, the term of this patent is extended or adjusted under 35 U.S.C. 154(b) by 0 days.

(21) Appl. No.: 15/921,485

(22) Filed: Mar. 14, 2018

(51) Int. Cl.
*H03F 1/02* (2006.01)
*H04B 3/36* (2006.01)
*H04L 25/24* (2006.01)
*H03F 3/45* (2006.01)

(52) U.S. Cl.
CPC .............. *H04B 3/36* (2013.01); *H03F 1/0205* (2013.01); *H03F 3/45179* (2013.01); *H04L 25/24* (2013.01); *H03F 2203/45026* (2013.01)

(58) Field of Classification Search
CPC ......... H04B 10/524; H04B 3/36; H04L 25/24; H03F 1/0205; H03F 3/45179; H03F 2203/45026
USPC .................. 375/211–215, 237–238, 257–294
See application file for complete search history.

(56) References Cited

U.S. PATENT DOCUMENTS

| | | | | |
|---|---|---|---|---|
| 4,681,111 A * | 7/1987 | Silvian | ................. | A61N 1/3727 128/903 |
| 5,941,990 A * | 8/1999 | Hiiragizawa | ......... | G06F 1/3203 713/310 |
| 5,963,053 A * | 10/1999 | Manohar | ........ | H03K 19/018528 326/37 |
| 6,690,192 B1 * | 2/2004 | Wing | ............... | H03K 19/00384 326/27 |
| 8,432,981 B1 * | 4/2013 | An | ........................... | H04K 3/22 375/260 |
| 8,489,781 B1 * | 7/2013 | An | ...................... | G06F 13/4295 320/137 |
| 8,552,801 B2 * | 10/2013 | Myles | .................... | H03F 1/0205 330/258 |
| 8,749,285 B1 * | 6/2014 | Choy | ................ | H04L 25/03878 327/161 |
| 8,797,835 B1 * | 8/2014 | Zhang | ...................... | H04B 3/32 370/201 |
| 8,804,792 B1 * | 8/2014 | Cheung | ................... | H04L 25/20 375/214 |
| 9,503,250 B2 * | 11/2016 | Van Rens | ................ | H04L 7/02 |
| 9,552,322 B2 * | 1/2017 | Yeung | ................. | G06F 13/4221 |
| 9,559,637 B2 * | 1/2017 | Yang | ..................... | H03F 1/0205 |
| 9,565,036 B2 * | 2/2017 | Zerbe | ................. | H04L 25/0264 |
| 9,654,310 B1 * | 5/2017 | Chang | ............... | H04L 25/03025 |
| 9,804,979 B2 * | 10/2017 | Sinclair | ............... | G06F 13/1684 |
| 10,104,148 B2 * | 10/2018 | Yang | ...................... | H04L 65/608 |
| 2002/0150116 A1 * | 10/2002 | Huang | .................. | H04B 3/548 370/431 |

(Continued)

Primary Examiner — James M Perez
(74) Attorney, Agent, or Firm — Weaver Austin Villeneuve & Sampson LLP

(57) ABSTRACT

Repeaters are described that operate to rapidly transition from low-power standby states to a low frequency signal transmission state. Bandwidth for high-frequency signal transmission is preserved.

23 Claims, 4 Drawing Sheets

(56) References Cited

U.S. PATENT DOCUMENTS

| | | | | |
|---|---|---|---|---|
| 2004/0059396 A1* | 3/2004 | Reinke | ............... | A61N 1/025 607/60 |
| 2004/0122490 A1* | 6/2004 | Reinke | ............... | A61N 1/025 607/60 |
| 2005/0046470 A1* | 3/2005 | Wang | ............... | G05F 3/245 327/543 |
| 2007/0052477 A1* | 3/2007 | Festo | ............... | H03F 1/0205 330/199 |
| 2008/0063091 A1* | 3/2008 | Dong | ............... | H04L 25/0276 375/257 |
| 2009/0015304 A1* | 1/2009 | Yin | ............... | H03L 7/06 327/162 |
| 2010/0013579 A1* | 1/2010 | Horan | ............... | H04L 1/205 333/28 R |
| 2010/0283532 A1* | 11/2010 | Horan | ............... | G09G 5/003 327/530 |
| 2011/0293041 A1* | 12/2011 | Luo | ............... | H04L 5/20 375/316 |
| 2012/0017016 A1* | 1/2012 | Ma | ............... | G06F 13/426 710/110 |
| 2012/0020404 A1* | 1/2012 | Hsieh | ............... | H04L 25/03006 375/231 |
| 2012/0087452 A1* | 4/2012 | Zerbe | ............... | H04L 25/0264 375/354 |
| 2012/0126612 A1* | 5/2012 | Hurwitz | ............... | H04B 3/54 307/3 |
| 2012/0128091 A1* | 5/2012 | Fountain | ............... | H04L 25/4908 375/295 |
| 2012/0154048 A1* | 6/2012 | Myles | ............... | H03F 1/0205 330/260 |
| 2012/0317446 A1* | 12/2012 | Jaramillo | ............... | G06F 11/221 714/43 |
| 2013/0156088 A1* | 6/2013 | Jin | ............... | H04L 25/03834 375/236 |
| 2013/0185578 A1* | 7/2013 | Tan | ............... | G06F 1/3234 713/323 |
| 2013/0262731 A1* | 10/2013 | Ranganathan | ............... | G06F 13/426 710/305 |
| 2013/0322461 A1* | 12/2013 | Poulsen | ............... | H04J 3/02 370/458 |
| 2014/0105230 A1* | 4/2014 | Kabiry | ............... | H04J 3/02 370/537 |
| 2014/0127998 A1* | 5/2014 | Miles | ............... | G06K 7/0008 455/41.1 |
| 2014/0207984 A1* | 7/2014 | Maung | ............... | G06F 13/385 710/105 |
| 2015/0363350 A1* | 12/2015 | Yeung | ............... | G06F 13/4221 710/106 |
| 2016/0006584 A1* | 1/2016 | Agrawal | ............... | H04L 5/20 375/299 |
| 2016/0179722 A1* | 6/2016 | Nakanishi | ............... | G06F 13/362 710/106 |
| 2016/0188502 A1* | 6/2016 | Sinclair | ............... | G06F 13/1684 710/104 |
| 2017/0207645 A1* | 7/2017 | Cohen | ............... | H02J 7/0052 |
| 2017/0310398 A1* | 10/2017 | Masuda | ............... | G06F 13/36 |
| 2018/0024950 A1* | 1/2018 | Sinclair | ............... | G06F 13/1684 710/104 |
| 2018/0199841 A1* | 7/2018 | Yang | ............... | A61B 5/685 |
| 2018/0341309 A1* | 11/2018 | Sporck | ............... | G06F 1/266 |
| 2018/0351405 A1* | 12/2018 | Zhou | ............... | H02J 50/12 |
| 2019/0034377 A1* | 1/2019 | Chen | ............... | G06F 13/4282 |
| 2019/0041954 A1* | 2/2019 | Chen | ............... | G06F 1/3215 |

* cited by examiner

REPEATERS WITH FAST TRANSITIONS FROM LOW-POWER STANDBY TO LOW-FREQUENCY SIGNAL TRANSMISSION

BACKGROUND

With the rapid increase in the volume of data consumption on mobile devices, the need for high bandwidth, compact, and power conserving signal conditioning circuits is growing. To support the high data volumes, signal conditioning circuits must satisfy stringent performance specifications, such as fast setup when exiting power down modes, low jitter, and low standby bias current. The rapidly growing throughput speeds for various I/O (input/output) standards is causing signal conditioning circuit design specifications to become more demanding and complicated.

The signal conditioning performed by a repeater is a critical task in serial communication systems. Repeaters are used in a wide range of applications, including redrivers and retimers. One objective of repeaters is to regenerate signals to boost the signal quality of high-speed interfaces. Repeaters are a key technology for addressing the signal integrity challenges that higher data rates introduce across every industry and serial data protocol.

Repeaters with power management often provide multiple standby states. Each standby state corresponds to a different amount of standby current consumption, such as for different biasing conditions. Typically, the lower the standby current, the longer it takes to transition to a signal transmission state. For example, the standby state with the highest current (i.e., the least power savings) may have a transition time in the range of microseconds, while the standby state with the lowest current (i.e., the most power savings) may be in the range of milliseconds.

Certain serial data protocols constrain the transition time from standby to transmitting low frequency signals used for sideband communications. In certain scenarios, a repeater may enter the standby states with greater power savings less often because of the need to comply with a transition time requirement.

SUMMARY

According to a first class of implementations, a circuit includes a power supply node and an internal circuit node. The circuit also includes voltage-mode circuitry including a buffer and a switch connected between an output node of the buffer and the power supply node, the voltage-mode circuitry configurable based in part on a first state of a signal detector to provide a low frequency signal conforming to a serial data protocol to the internal circuit node via the buffer. The circuit also includes current-mode circuitry including the switch and a current-mode amplifier, the current-mode circuitry configurable based in part on a second state of the signal detector to provide a high frequency signal conforming to the serial data protocol to the internal circuit node via the current-mode amplifier.

Implementations within the first class of implementations may include one or more of the following features in any suitable combination. The circuit where the buffer includes a tri-state device, the tri-state device being configured to cause the output node of the buffer to follow an input signal to the buffer in response to an indication that the signal detector is in the first state, the tri-state device also being configured to cause a high impedance at the output node of the buffer in response to an indication that the signal detector is in the second state. The circuit further including: switch control logic configured to cause the switch to connect the output node of the buffer to the power supply node when the signal detector is in the second state such that the voltage-mode circuitry does not degrade a signaling bandwidth of the current-mode circuitry. The circuit where the serial data protocol corresponds to one of a DisplayPort standard, a serial ATA standard, a peripheral component interconnect express (PCI-E) standard, or a universal serial bus (USB) standard. The circuit where the high frequency signal corresponds to a universal serial bus (USB) SuperSpeed signal or USB SuperSpeedPlus signal, and the low frequency signal corresponds to a USB low-frequency periodic signal (LFPS) signal. The circuit further including: an internal impedance element. The circuit further including a current source. The circuit further including a transmit port for coupling an external load impedance to the internal circuit node. The circuit further where the current-mode circuitry is configured to drive the high frequency signal at the internal circuit node based in part on a current magnitude of the current source and a parallel equivalent impedance corresponding to the internal impedance element and the external load impedance, and where the voltage-mode circuitry is configured to drive the low frequency signal at the internal circuit node based in part on a voltage magnitude at the output node of the buffer and a series equivalent impedance corresponding to the internal impedance element and the external load impedance. The circuit where the current-mode circuitry and voltage-mode circuitry both include the internal impedance element and the switch. The circuit where the signal detector is configured to detect a presence of the low frequency signal, and the signal detector being in the first state corresponds to a reduced bias current for at least one of the current-mode amplifier in the current-mode circuitry, a predriver for the current-mode amplifier, or a preemphasis circuit for the current-mode amplifier.

According to a second class of implementations, a circuit includes: a power supply node; a first internal circuit node; a second internal circuit node. The circuit also includes voltage-mode circuitry including a first buffer, a first switch, a second buffer, and a second switch, the first switch being connected between the power supply node and an output node of the first buffer, the second switch being connected between the power supply node and an output node of the second buffer, the voltage-mode circuitry being configurable based in part on a first state of a signal detector to provide a differential low frequency signal conforming to a serial data protocol at the first and second internal circuit nodes via the first and second buffers. The circuit also includes current-mode circuitry including the first and second switches and a differential current-mode amplifier, the current-mode circuitry being configurable based in part on a second state of the signal detector to provide a differential high frequency signal conforming to the serial data protocol to the first and second internal circuit nodes via the differential current-mode amplifier.

Implementations within the second class of implementations may include one or more of the following features in any suitable combination. The circuit where each of the first and second buffers includes a tri-state device, the tri-state device being configured to cause the corresponding output node of each buffer to follow a corresponding input signal to each buffer in response to an indication that the signal detector is in the first state, the tri-state device also being configured to cause a high impedance at the corresponding output node of each buffer in response to an indication that the signal detector is in the second state. The circuit further including: switch control logic configured to cause the first and second switches to connect the output nodes of the first and second buffers to the power supply node when the signal detector is in the second state such that the voltage-mode circuitry does not degrade signaling bandwidth of the current-mode circuitry. The circuit where the serial data protocol corresponds to one of a DisplayPort standard, a serial ATA standard, a peripheral component interconnect express (PCI-E) standard, or a universal serial bus (USB) standard. The circuit where the differential high frequency signal corresponds to a universal serial bus (USB) SuperSpeed signal or USB SuperSpeedPlus signal, and the differential low frequency signal corresponds to a USB differential low frequency periodic signal (LFPS) signal. The circuit further including: a first internal impedance element. The circuit further including a second internal impedance element. The circuit further including a current source. The circuit further including a transmit port for coupling a first external load impedance and a second external load impedance to the first and second internal circuit nodes. The circuit further where the current-mode circuitry is configured to drive each end of the differential high frequency signal at the first and second internal circuit nodes based in part on a current magnitude of the current source and a parallel equivalent impedance corresponding to the associated internal impedance element and the associated external load impedance for the particular end of the differential high frequency signal, and where. The circuit further including the voltage-mode circuitry is configured to drive each end of the differential low frequency signal at the first and second internal circuit nodes based in part on a voltage magnitude at the associated output node of the associated buffer and a series equivalent impedance corresponding to the associated internal impedance element and the associated external load impedance for the particular end of the differential low frequency signal. The circuit where the current-mode circuitry and voltage-mode circuitry both include the first and second internal impedance elements and the first and second switches. The circuit where the signal detector is configured to detect a presence of the differential low frequency signal, and the signal detector being in the first state corresponds to a reduced bias current for at least one of the differential current-mode amplifier in the current-mode circuitry, a predriver for the differential current-mode amplifier, or a preemphasis circuit for the differential current-mode amplifier.

According to a third class of implementations, a circuit includes: an internal circuit node; first circuitry configurable to operate in a voltage mode to transmit a low frequency signal to the internal circuit node, the low frequency signal corresponding to a serial data protocol; and second circuitry configurable to operate in a current mode to transmit a high frequency signal to the internal circuit node, the high frequency signal corresponding to the serial data protocol.

Implementations within the third class of implementations may include one or more of the following features in any suitable combination. The circuit further including a buffer having an output node connected to a power supply node through a switch, the buffer including a tri-state device: the tri-state device being configured to cause the output node of the buffer to follow an input signal to the buffer in response to an indication that a signal detector is in a first state. The circuit further including the tri-state device also being configured to cause a high impedance at the output node of the buffer in response to an indication that the signal detector is in a second state. The circuit further including: switch control logic configured to cause the switch to connect the output node of the buffer to the power supply node when the signal detector is in the second state such that the voltage mode circuitry does not degrade a signaling bandwidth of the current-mode circuitry. The circuit further including: an internal impedance element. The circuit further including a current source. The circuit further including a transmit port for coupling an external load impedance to the internal circuit node. The circuit further where the current mode circuitry is configured to drive the high frequency signal at the internal circuit node based in part on a current magnitude of the current source and a parallel equivalent impedance corresponding to the internal impedance element and the external load impedance, and where. The circuit further including the voltage mode circuitry is configured to drive the low frequency signal at the internal circuit node based in part on a voltage magnitude at the output node of the buffer and a series equivalent impedance corresponding to the internal impedance element and the external load impedance. The circuit where the current-mode circuitry and voltage-mode circuitry both include the internal impedance element and the switch. The circuit where the signal detector is configured to detect a presence of the low frequency signal, and the signal detector being in the first state corresponds to a reduced bias current for at least one of a current mode amplifier in the current mode circuitry, a predriver for the current mode amplifier, or a preemphasis circuit for the current mode amplifier. The circuit further including repeaters with fast transitions from low-power standby to signal transmission The circuit where the serial data protocol corresponds to one of a DisplayPort standard, a serial ATA standard, a peripheral component interconnect express (PCI-E) standard, or a universal serial bus (USB) standard. The circuit where the high frequency signal corresponds to a universal serial bus (USB) SuperSpeed signal or USB SuperSpeedPlus signal, and the low frequency signal corresponds to a USB low-frequency periodic signal (LFPS) signal.

A further understanding of the nature and advantages of various implementations may be realized by reference to the remaining portions of the specification and the drawings.

DETAILED DESCRIPTION

Figure 1:
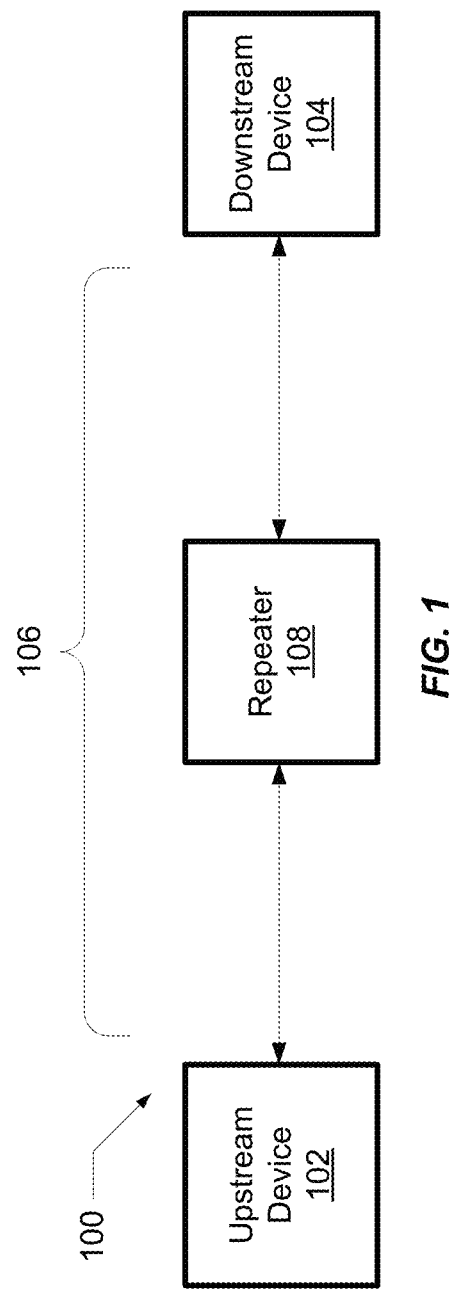
FIG. 1 is a simplified block diagram in a serial data transmission system including a repeater.

Reference will now be made in detail to specific implementations. Examples of these implementations are illustrated in the accompanying drawings. These examples are provided for illustrative purposes and are not intended to limit the scope of this disclosure. Rather, alternatives, modifications, and equivalents of the described implementations are included within the scope of this disclosure as defined by the appended claims. In addition, specific details may be provided in order to promote a thorough understanding of the described implementations. Some implementations within the scope of this disclosure may be practiced without some or all of these details. Further, well known features may not have been described in detail for the sake of clarity.

Repeaters for transmitting low-frequency signals and high-frequency signals in accordance with serial data protocols are described. Repeaters enabled by the present disclosure are designed to facilitate fast transitions from low power standby states to a low frequency signal transmission state.

The fast transitions from standby states to a low frequency signal transmission state enabled by the present disclosure increases the duration in which standby states with greater power savings can be utilized, thereby reducing overall power consumption.

In certain implementations, a repeater has voltage-mode circuitry for low-frequency signaling and current-mode circuitry for high-frequency signaling. The relationship between the voltage-mode circuitry and current-mode circuitry is such that a fast transition from standby to low-frequency signaling is enabled even from a very low-power standby mode. The transition time may occur in the time range of nano seconds because the voltage-mode circuitry transitions out of a high-impedance state rather than a low-power state. By transitioning out of a high-impedance state, the voltage-mode circuitry does not involve the delay for bias stabilization that occurs when current-mode circuitry exits from a very low-power standby mode.

According to various implementations, a repeater includes an amplifier for transmitting high-frequency signals to an internal circuit node of the repeater using current-mode operation. The amplifier is coupled to switching circuitry that can selectively disconnect a supply voltage to put the amplifier into a standby state.

In certain implementations, the internal circuit node is the same as or closely connected to the output node of the amplifier. For some implementations, the amplifier is a differential amplifier, and the voltage at the output node of the amplifier is determined by the amount of current flowing through an impedance at the output node of the amplifier.

When the amplifier is in the standby state, a tri-state device transitions from a high impedance mode to a transmit mode. In the transmit mode, the tri-state device transmits a low frequency signal to the same internal circuit node using voltage-mode operation.

The transition time of the tri-state device from the high impedance mode to the transmit mode is shorter than the time for the amplifier bias to stabilize when emerging from standby.

According to a particular class of implementations, the output node of the tri-state device is connected to the supply voltage through the same switching circuitry that provides a supply voltage to the amplifier. When the amplifier is powered, the switching circuitry is closed such that the output node of the tri-state device is pulled up to the supply voltage. Because the output node of the tri-state device presents a high impedance relative to, for example, a 50 ohm termination impedance, when the amplifier is active and ready to transmit a high-frequency signal, the tri-state device does not introduce a significant parasitic capacitance that would degrade the bandwidth of the amplifier.

According to a particular class of implementations, the internal circuit node of the repeater to which the output nodes of the tri-state device and the amplifier are both connected is also connected to an internal impedance element that is matched to the impedance of a load to be connected to the repeater. The internal impedance element provides electrostatic discharge (ESD) protection for the tri-state device.

According to a particular class of implementations, the transition of the tri-state device to the transmit mode is responsive to a control signal that indicates the presence of a low-frequency signal. The control signal is provided by a signal detector that is independent of the amplifier. Therefore, the control logic for the tri-state device does not depend on the specific configuration of a particular standby state for the amplifier.

The present disclosure enables repeaters that may be characterized by one or more of the following features: low standby power consumption, fast transition from standby to low frequency signal transmission, strong ESD protection, low control logic complexity, reduced bandwidth degradation for high-frequency signaling, and/or efficient use of semiconductor die area. Some examples will be illustrative.

FIG. 1 is a block diagram depicting an example of an implementation of a serial bus communication system 100. Serial bus communication system 100 includes upstream device 102, downstream device 104, and serial bus 106.

Serial bus 106 includes one or more intermediary signal conditioning devices (singly and collectively "repeater 108") coupled in series. A repeater as used herein is a device that is placed in a transmit channel (transmit chain) to compensate for channel degradation. Repeaters include but are not limited to redrivers and retimers. A redriver equalizes the upstream channel signal and retransmits the signal to the downstream channel. A redriver does not have a clock and data recovery (CDR) circuit, and no retiming is performed when the redriver retransmits the signal. A retimer equalizes the upstream channel signal, recovers the clock using a CDR, and generates a signal that is transmitted to the downstream channel.

It should be appreciated that a single repeater 108 may be used in serial bus 106 depending on trace or cable length of the serial bus. For purposes of clarity and not limitation, it shall be assumed that traces are used. Thus, repeater 108 may be used as a serial link driver interface for serial bus 106, or multiple repeaters 108 may be used to provide a serial link driver interface for serial bus 106. Additionally, it should be appreciated that serial bus 106 includes traces formed in a transmission medium such as conductive material or other means for propagating electrical signals. It should also be appreciated that for implementations in which multiple repeaters 108 are used, one or more of the multiple repeaters may include the repeater implementations as described herein.

It should be appreciated that serial bus communication system 100 may be a bidirectional communication system, where the upstream device 102 is capable of both transmitting and receiving, and the downstream device 104 is capable of both transmitting and receiving. Bidirectional implementations of serial bus communication system 100 include full-duplex implementations with two repeaters, one in the transmit chain for upstream device 102, and one in the transmit chain for downstream device 104. It should also be appreciated that the two repeaters can be in one device or in separate devices.

Bidirectional implementations of serial bus communication system 100 also include half-duplex implementations with one repeater and switching interfaces for the transmit and receive ports. It should further be appreciated that serial bus communication system 100 may be a unidirectional communication system, where upstream device 102 is capable of transmitting and downstream device 104 is capable of receiving, or where upstream device 102 is capable of receiving and downstream device 104 is capable of transmitting. In unidirectional communication systems, the single transmit chain, whether for upstream device 102 or downstream device 104, includes the repeater implementations described herein.

Upstream device 102 may be implemented in a larger block such as any in a variety of integrated circuits or devices including, but not limited to, input/output ("I/O") hubs, root complexes, servers, and laptop docking stations, among others. Furthermore, it should be appreciated that downstream device 104 may be embedded in a larger block such as any in a variety of peripheral devices including, but not limited to, hard disk drives, graphics cards, and daughter cards, among others. It should be appreciated that reference to upstream device and downstream device are for illustrative purposes, and the examples of upstream device 102 and downstream device 104 listed above can correspond to terminal communication devices for serial standards that do not utilize a host-slave or hierarchical topology.

Upstream device 102 may include a differential output driver (not shown) for providing a differential signal. Repeater 108 processes an output transmission from upstream device 102 to provide such processed output transmission to another repeater or directly to downstream device 104. Downstream device 104 may include a differential input driver (not shown).

There are many known differential digital signaling protocols that may be used with serial bus communication system 100 such as, for example, Current-mode Logic ("CML"), differential Stub-Series Terminated Logic ("SSTL"), differential High-Speed Transceiver Logic ("HSTL"), Low-Voltage Differential Signaling ("LVDS"), differential Low-Voltage Positive Emitter Coupled Logic ("LVPECL"), and Reduced Swing Differential Signaling ("RSDS") among other differential digital signaling protocols. Additionally, implementations are contemplated that use single-ended serial interface protocols such as, for example, Low Voltage Transistor-Transistor Logic ("LVTTL") such as used for PCI, and Low Voltage Complementary Metal Oxide Semiconductor ("LVCMOS"), among other single-ended serial interface protocols. It should be appreciated that communication via serial bus 106 may use a differential or single-ended signaling protocol.

Figure 2:
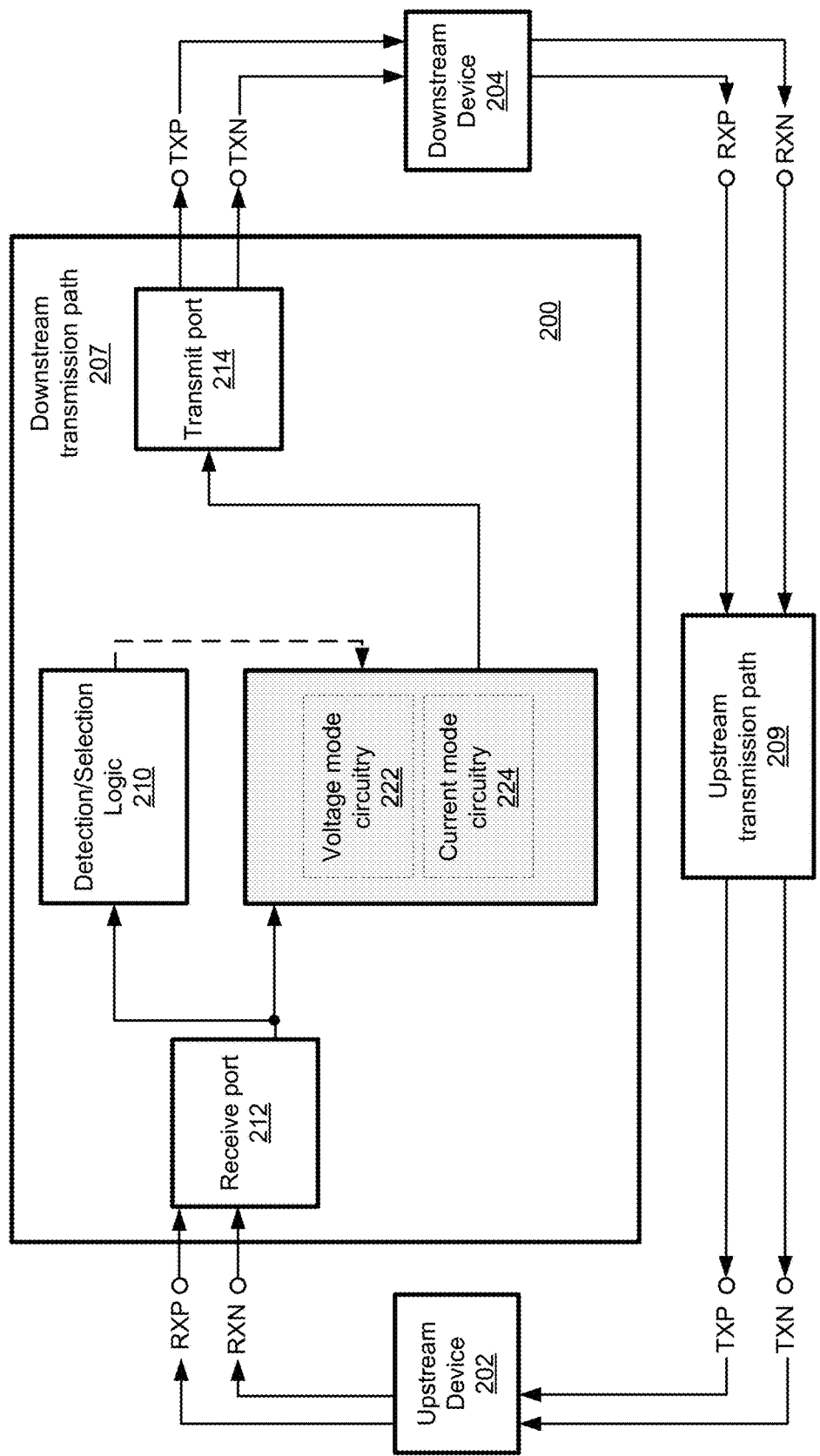
FIG. 2 is a simplified block diagram of a specific implementation of a repeater.

FIG. 2 is a simplified block diagram of a particular implementation of a repeater 200 that operates with a fast transition time from a standby state to a low-frequency signal transmission state.

Repeater 200 includes receive port 212 for receiving an incoming signal. Repeater 200 further includes voltage-mode circuitry 222 and current-mode circuitry 224, each configured to receive the incoming signal from receive port 212. Voltage-mode circuitry 222 and current-mode circuitry 224 are also each configured to provide outputs to transmit port 214 for transmitting a signal to a load, such as downstream device 204.

It should be noted that certain circuit elements within repeater 200 are shared between voltage-mode circuitry 222 and current-mode circuitry 224. Nonlimiting examples of shared circuit elements include internal impedance elements, switches for connecting to a supply voltage, and signal detectors. The sharing of circuit elements between voltage-mode circuitry 222 and current-mode circuitry 224 may allow for a reduction in the size of repeater 200 relative to conventional repeaters.

Repeater 200 also includes selection logic 210 for controlling whether the one or more outputs of voltage-mode circuitry 222 or current-mode circuitry 224 are provided to transmit port 214. It should be noted that FIG. 2 only shows downstream transmission path 207 from upstream device 202 to downstream device 204. However, it will be understood that upstream transmission path 209 can include substantially identical circuitry for transmission of serial data from downstream device 204 to upstream device 202.

For clarity purposes, signal paths within repeater 200 are depicted as single ended. However, it should be understood that the signal paths may be differential, as illustrated by the RXP and RXN pair of traces from upstream device 202, or single-ended. It should further be noted that the incoming data may use non-return to zero (NRZ) or return to zero (RZ) signaling.

It should be appreciated that FIG. 2 depicts repeater 200 as being separate from the transmitter circuitry of upstream device 202. However, it should further be appreciated that repeater 200 as described herein can be included in the transmitter circuitry of upstream device 202, or the transmitter circuitry of downstream device 204.

A conventional repeater includes current-mode circuitry for transmitting both high-frequency data signals and low-frequency link management signals. The current-mode circuitry is configured to be in different low-power states corresponding to different biasing conditions. For example, the current-mode circuitry is designed for compatibility with versions 3.0 and 3.1 of the Universal Serial Bus (USB) standard. Version 3.0 is described in the *Universal Serial Bus 3.0 Specification*, Revision 1.0, Jun. 6, 2011 (USB 3.0 or gen 1); version 3.1 is described in the *Universal Serial Bus 3.1 Specification*, Revision 1.0, Jul. 26, 2013 (USB 3.1 or gen 2); both of which are incorporated herein by reference in their entireties for all purposes.

In the USB standard, the low-power states correspond to the U1, U2 and U3 states. Specifically, the longer a link remains idle, the deeper the power savings that can be achieved by progressing from U0 (link active) to U1 (link standby with fast exit), to U2 (link standby with slower exit), to U3 (suspend).

Each of these states has a respective timing requirement to exit from the low-power state and begin transmitting a low-frequency periodic signal (LFPS). In USB 3.0, the LFPS is a sideband handshake sent on the SuperSpeed data lines at a lower frequency (10-50 MHz instead of 5 Gbps). This sideband signal helps to manage signal initiation and low power management.

A USB transmitter at U1 consumes more current due to the need to comply with the fastest response time requirement being in the microsecond range, whereas a USB transmitter at U3, the state with the slowest response time being in the millisecond range, consumes the least current. This transition is normally initiated when a packet needs to be transmitted. The LFPS provides a low-power mechanism to send a "wake signal" to a link partner. Both sides must interact with an LFPS "handshake" to avoid entering the Recovery link state, which involves utilizing a low-latency recovery sequence to re-train links, before the link partner is ready.

A mixed mode repeater enabled by the present disclosure is a repeater with current-mode circuitry for transmitting a high-frequency signal, such as Superspeed (USB 3.0) or SuperspeedPlus (USB 3.1) signals, and voltage-mode circuitry for transmitting a low-frequency signal such as the LFPS. The mixed mode repeater eliminates the need for current-mode circuitry to remain in a higher standby bias current state, such as U1, in order to meet response time requirements for initiating transmission of signals such as the LFPS. Instead, the current-mode circuitry can remain in U3, the state with minimal standby bias current, and voltage-mode circuitry can undergo fast set up to transmit signals such as the LFPS. As a result, the mixed mode repeater consumes less power relative to a repeater using only a current-mode.

Examples of applications where a mixed mode repeater is advantageous includes notebooks, netbooks, tablets, smartphones and other power sensitive consumer devices that require judicious use of power in order to maximize battery life. Moreover, particular implementations of a mixed mode repeater enabled by the present disclosure decrease the overall cost and complexity of the repeater design due to simplified control logic for switching between high-frequency and low-frequency signaling.

It should again be noted that the principles described with reference to the examples described herein are generally applicable to high-speed serial interfaces including, for example, repeaters implemented according to the DisplayPort standard, the Serial ATA (SATA) standard, the Peripheral Component Interconnect Express (PCI-E) standard, or the Universal Serial Bus (USB) standard. The scope of the present disclosure should therefore not be limited by reference to the examples described herein.

Figure 3:
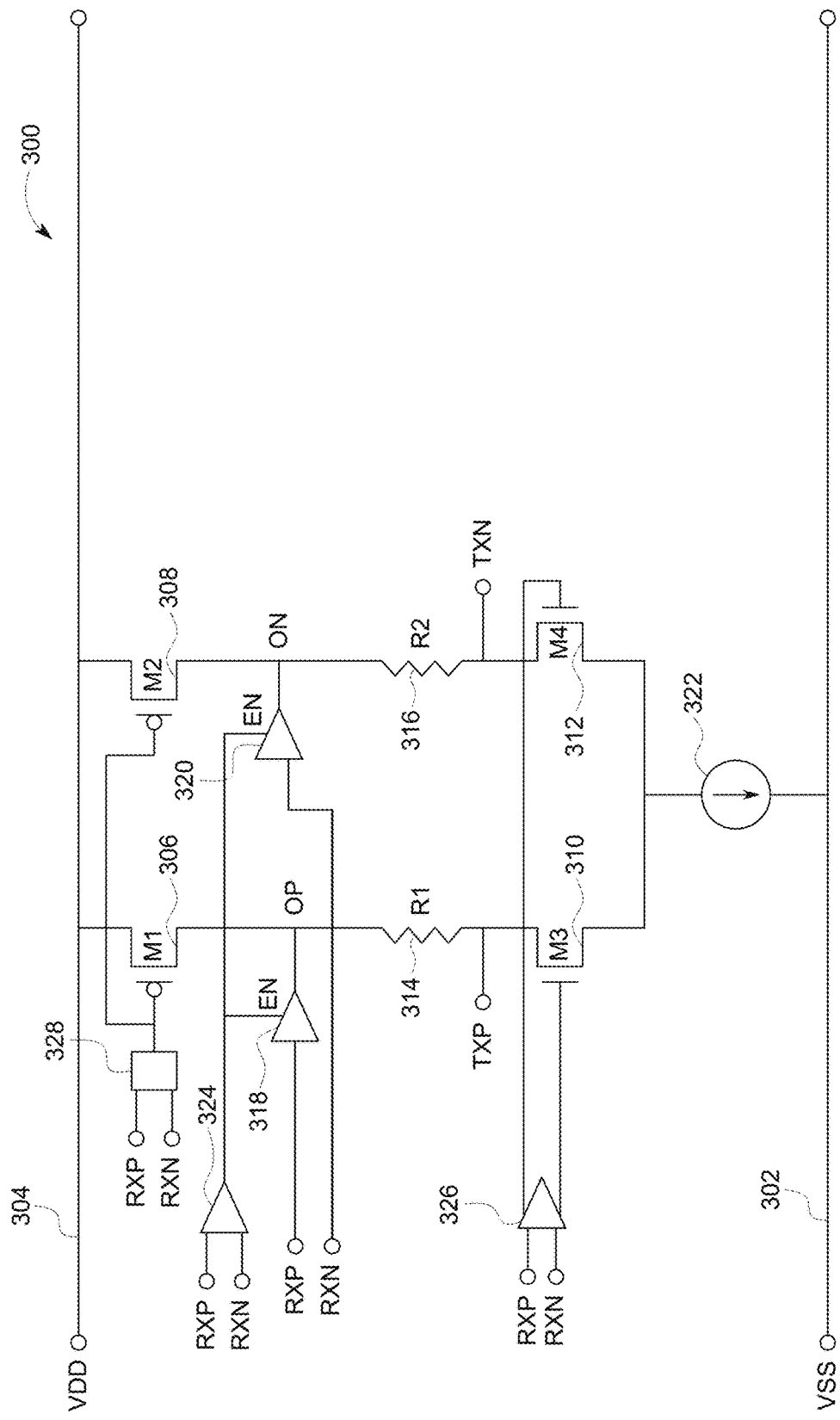
FIG. 3 is a simplified block diagram of another specific implementation of a repeater.

FIG. 3 depicts a repeater 300 that includes both current-mode circuitry and voltage-mode circuitry. In the depicted implementation, the current mode circuitry includes a current source 322 coupled to the source terminals of transistors M3 and M4 which are configured as a dual input, balanced output differential amplifier. Specifically, the drain of M3 is coupled to first node TXP at a first terminal of resistor R1, and the drain of M4 is coupled to second node TXN at a first terminal of resistor R2. The differential amplifier provides a high common mode rejection ratio (CMRR) and DC balance at the internal circuit nodes corresponding to TXP and TXN, which is beneficial for maintaining signal integrity for USB 3.0 SuperSpeed and other high-speed serial data protocols.

It should be appreciated that the differential pair of nodes TXP and TXN are each coupled to a load (not shown) with a characteristic impedance of, for example, 50 ohms. It should further be appreciated that R1 and R2 are each 50 ohms such that signal reflections from the 50 ohm load impedances are minimized.

The second terminal of R1 and R2 are each coupled to power supply node VDD 304 through the drain terminals of transistors M1 and M2, respectively, with each transistor acting as a switch. When the gates of M1 and M2 are pulled high (switches are open), the differential amplifier in the current-mode circuitry is off, such as, for example, in a minimum standby current consumption state. It should be noted that the power supply node can correspond to a wide variety of voltage or current sources as known in the art, including but not limited to a nonregulated supply, a regulated supply, or a regulated supply that is regulated to a different value (e.g., a regulated supply at 1.8V that is regulated down to 1V).

Bringing the differential amplifier into an active state for repeating an incoming signal includes pulling up the gates of M1 and M2 (switches are closed), and waiting for the bias, such as at transistors M3 and M4, to stabilize. Because the stabilization time in a conventional repeater exceeds the transition time specified by the USB standard in certain usage scenarios, a conventional repeater avoids configuring the differential amplifier to enter the minimum standby current state in such scenarios. Thus, the conventional repeater sacrifices power savings to comply with transition time requirements. It should be appreciated that there may be other low-power states other than the minimum standby current state that exceed a transition time requirement for a particular link management scenario, and are similarly underutilized by conventional repeaters for power conservation purposes.

In contrast, in repeater 300, a signal such as the USB LFPS or SATA out of band (OOB) signal is transmitted using the voltage-mode circuitry without pulling up the gates of M1 and M2. The setup time for the voltage-mode circuitry is faster than for the differential amplifier because the voltage-mode circuitry is not transitioning out of a low-power state, and therefore a similar delay for bias stabilization does not result. Instead, the voltage-mode circuitry transitions out of a high-impedance state, which in certain implementations may occur in the time range of nano seconds.

As used herein, voltage-mode and current-mode describe driver circuitry. In communication systems, drivers send signals through a channel, such as a 50 ohm trace. The driver is designed to provide sufficient voltage and current for the anticipated channel, and often consumes the most power in a repeater.

In a current-mode architecture, the voltage of a driven signal is based on a current source and the parallel equivalence of an internal impedance and a load impedance. For example, the voltage of a driven signal at node TXP in FIG. 3 is based on the magnitude of current source 322 and the parallel equivalence of resistor R1 and the impedance of a load (not shown) at TXP.

In a voltage-mode architecture, the voltage of a driven signal is based on a voltage source and the series equivalence of an internal impedance and a load impedance. For example, the voltage at TXP depends on the magnitude of the voltage at output node OP of tri-state device 318 and the series equivalence of resistor R1 and the impedance of a load at TXP.

It should be appreciated that the power saved by leaving the differential amplifier in the current-mode circuitry in standby and operating the voltage-mode circuitry even without a low-power standby state results in a net power savings. In some implementations, because the voltage-mode circuitry does not require a predriver, such as predriver 326 for the current-mode circuitry, the power consumption of the voltage-mode circuitry is lower than for the current-mode circuitry. However, it should be noted that implementations are contemplated in which the voltage-mode circuitry can have one or more low-power standby states that contributes to net power savings.

In FIG. 3, the voltage-mode circuitry drives the nodes TXP and TXN with tri-state devices 318 and 320, respectively. The output nodes of tri-state devices 318 and 320, OP and ON, respectively, are connected to the second terminals of R1 and R2, respectively. Thus, the current-mode circuitry drives nodes TXP and TXN through transistors M3 and M4 at the first terminals of R1 and R2, whereas the voltage-mode circuitry drives nodes TXP and TXN through the output nodes of tri-state devices 318 and 320 at the second terminals of R1 and R2. In other words, the current-mode circuitry and the voltage-mode circuitry share R1 and R2. It should be appreciated that internal impedance elements (e.g., 50 ohm resistors) such as R1 and R2 consume relatively large areas of a semiconductor die, so reuse of R1 and R2 allows efficient use of space even with repeater 300 having mixed modes (e.g., voltage-mode and current-mode) of operation. It should further be appreciated that R1 and R2 protect tri-state devices 318 and 320 from electrostatic discharge (ESD) coming through nodes TXP and TXN.

The current-mode circuitry and the voltage-mode circuitry of repeater 300 also share switches M1 and M2. When the voltage-mode circuitry is active and ready to repeat a signal such as the LFPS, transistors M3 and M4 and the current source 322 are powered off such that the differential amplifier in the current-mode circuitry is placed into a low-power state. Furthermore, by having the switches M1 and M2 be open, output nodes OP and ON are determined by the outputs of tri-state devices 318 and 320, rather than being pulled up to VDD.

When tri-state devices 318 and 320 are in a high impedance state and the current-mode circuitry is ready to repeat a signal, switches M1 and M2 are closed such that the differential amplifier is biased for signal transmission. By having switches M1 and M2 closed, output nodes OP and ON of tri-state devices 318 and 320 are pulled up to VDD (with a small V=IR voltage drop due to, for example, the internal resistance of the switches M1 and M2). As a result of the high impedance of OP and ON being connected in parallel to the low impedance of VDD, regardless of the size of circuit elements in the tri-state devices (e.g., transistor gate sizes), minimal parasitic capacitance is introduced at the outputs of the differential amplifier. In other words, the presence of the tri-state devices does not appreciably degrade the bandwidth for high-speed signaling, such as the 5 Gb per second data rate for USB 3.0 Superspeed signals. Thus, the presently disclosed repeater designs enable both a reduction in overall power consumption and preservation of high signaling bandwidth.

It should be appreciated that similar to resistors R1 and R2, the reuse of switches M1 and M2 between the voltage-mode and the current-mode circuitry allows efficient use of die area.

In some implementations, switches M1 and M2 are controlled by biasing control logic 328. Based on the link power management scheme for a particular serial data protocol, biasing control logic 328 turns off the differential amplifier in the current-mode circuitry through configuring switches M1 and M2 (which in this example are PMOS devices) to be open by pulling high their gates. Biasing control logic 328 configures switches M1 and M2 to be closed when the current-mode circuitry is ready to repeat a signal, or for other high-speed states. For example, when switches M1 and M2 are closed, a voltage divider network can be configured for R1 and R2, and/or the current provided by current source 322 can be reduced for lower standby current. It should be appreciated that one or more outputs of biasing control logic 328 (not depicted in FIG. 3) may be provided to control voltage divider circuitry and/or current source 322 for such purposes. It should further be appreciated that while FIG. 3 depicts biasing control logic 328 as receiving upstream device signals RXP and RXN as inputs, biasing control logic 328 can receive a variety of other inputs, such as analog or digital indications from a signal detector, and/or control logic signals.

It should be appreciated that the pair of PMOS transistors depicted in FIG. 3 for switches M1 and M2 are merely illustrative, and that a person having ordinary skill in the art would understand that a wide variety of alternative circuits can be used to implement switches M1 and M2.

Tri-state control logic 324 provides one or more control inputs to tri-state devices 318 and 320. Based in part on indications from tri-state control logic 324 to control the tri-state devices to propagate the LFPS, the output nodes of the tri-state devices, OP and ON, will follow the signal states at the inputs of tri-state devices 318 and 320 (RXP and RXN as depicted in FIG. 3).

It should be appreciated that while the present discussion of tri-state devices 318 and 320 are in the context of a digital buffer that follows a received signal, in some implementations, the tri-state devices may include or be coupled to circuitry providing inversion, amplification, attenuation, delay, filtering, preemphasis for low frequency signals, and/or other signal conditioning.

Based in part on indications from tri-state control logic 324 to disable signal propagation, the output nodes OP and ON are set to high impedance mode, thereby allowing repeater 300 to repeat a high-frequency signal using the current-mode circuitry.

In some implementations, tri-state control logic 324 includes a signal detector. For example, tri-state control logic 324 detects the presence of the LFPS and controls the tri-state devices to exit high impedance mode. As another example, tri-state control logic 324 may generate control signals based in part on detecting the absence of USB SuperSpeed signals. In certain implementations, tri-state control logic 324 may receive one or more signals from biasing control logic 328, such as an indication that the current-mode circuitry is in a low-power state, e.g., the U3 state At least some repeater designs enabled by the present disclosure allow for a reduction in control logic complexity. For example, due to the setup time for tri-state devices 318 and 320 complying with the most stringent transition requirement in the USB standard (i.e., U1 to U0), various implementations of tri-state control logic 324 may not require determining and coordinating with whether the current-mode circuitry is in the U1, U2, or the U3 state. Furthermore, because the LFPS signal (which requires disabling high-frequency signal preemphasis) is not transmitted by the current-mode circuitry (as with conventional designs), the on/off toggling of preemphasis for the current-mode circuitry is unnecessary.

It should be appreciated that the separate depiction of biasing control logic 328 and tri-state control logic 324 in FIG. 3 is merely for illustrative purposes, and one of ordinary skill in the art would realize that such control logic may be combined or distributed in repeater 300 in a variety of arrangements.

Figure 4A:
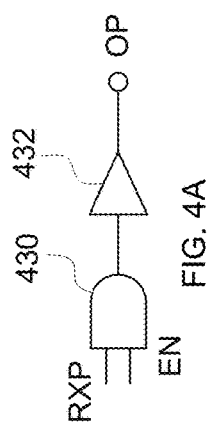
FIG. 4A is a simplified block diagram of a specific implementation of a tri-state device.

FIG. 4A depicts an example of an implementation of a tri-state device suitable for use as tri-state devices 318 and 320. The tri-state device shown uses a tri-state logic gate 430 and an output driving buffer 432. Tri-state logic gate 430 includes a first input RXP corresponding to a single ended input, or one signal in a differential pair (RxP and RxN). Tri-state logic gate 430 includes a second input EN corresponding to an enable signal. When EN is high, the output of buffer 432 follows the input to gate 430. When EN is low, the output of buffer 432 is high impedance, which allows sharing of circuitry with the current-mode circuitry as described above.

Figure 4B:
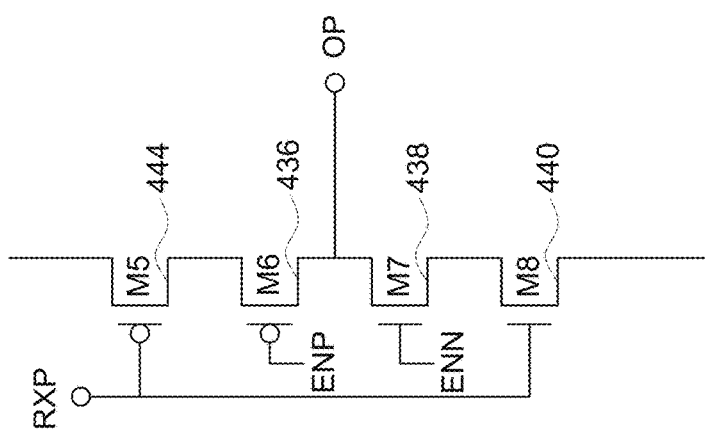
FIG. 4B is a simplified block diagram in of another specific implementation of a tri-state device.

As another nonlimiting example, FIG. 4B depicts an implementation of a tri-state device using PMOS transistors M5 and M6, and NMOS transistors M7 and M8. Depending on the state of complementary enable signals at the gates of transistors M6 and M7, the output OP is either the inverted input at the gates of transistors M5 and M8, or is high impedance. One of ordinary skill in the art would realize that tri-state devices 318 and 320 can be implemented in a variety of circuit designs, including but not limited to transmission gates, gating switches, logic gates, buffers, and so forth.

Various implementations described herein may be implemented using any in a variety of standard or proprietary CMOS processes. In addition, it should be noted that implementations are contemplated that may employ a much wider range of semiconductor materials and manufacturing processes including, for example, GaAs, SiGe, etc. Repeaters as described herein may be represented (without limitation) in software (object code or machine code in non-transitory computer-readable media), in varying stages of compilation, as one or more netlists (e.g., a SPICE netlist), in a simulation language, in a hardware description language (e.g., Verilog, VHDL), by a set of semiconductor processing masks, and as partially or completely realized semiconductor devices (e.g., an ASIC). Some implementations may be a standalone integrated circuit, while others may be embedded as part of larger system on a chip.

It will be understood by those skilled in the art that changes in the form and details of the implementations described above may be made without departing from the scope of this disclosure. In addition, although various advantages have been described with reference to some implementations, the scope of this disclosure should not be limited by reference to such advantages. Rather, the scope of this disclosure should be determined with reference to the appended claims.

What is claimed is:

1. A circuit, comprising:
a power supply node;
an internal circuit node;
voltage-mode circuitry including a buffer and a switch connected between an output node of the buffer and the power supply node, the voltage-mode circuitry configurable based in part on a first state of a signal detector to provide a low frequency signal conforming to a serial data protocol to the internal circuit node via the buffer; and
current-mode circuitry comprising the switch and a current-mode amplifier, the current-mode circuitry configurable based in part on a second state of the signal detector to provide a high frequency signal conforming to the serial data protocol to the internal circuit node via the current-mode amplifier.

2. The circuit of claim 1, wherein the buffer comprises a tri-state device, the tri-state device being configured to cause the output node of the buffer to follow an input signal to the buffer in response to an indication that the signal detector is in the first state, the tri-state device also being configured to cause a high impedance at the output node of the buffer in response to an indication that the signal detector is in the second state.

3. The circuit of claim 1, further comprising:
switch control logic configured to cause the switch to connect the output node of the buffer to the power supply node when the signal detector is in the second state such that the voltage-mode circuitry does not degrade a signaling bandwidth of the current-mode circuitry.

4. The circuit of claim 1, wherein the serial data protocol corresponds to one of a DisplayPort standard, a Serial ATA standard, a Peripheral Component Interconnect Express (PCI-E) standard, or a Universal Serial Bus (USB) standard.

5. The circuit of claim 1, wherein the high frequency signal corresponds to a Universal Serial Bus (USB) SuperSpeed signal or USB SuperspeedPlus signal, and the low frequency signal corresponds to a USB low-frequency periodic signal (LFPS) signal.

6. The circuit of claim 1, further comprising:
an internal impedance element;
a current source; and
a transmit port for coupling an external load impedance to the internal circuit node;
wherein the current-mode circuitry is configured to drive the high frequency signal at the internal circuit node based in part on a current magnitude of the current source and a parallel equivalent impedance corresponding to the internal impedance element and the external load impedance, and wherein the voltage-mode circuitry is configured to drive the low frequency signal at the internal circuit node based in part on a voltage magnitude at the output node of the buffer and a series equivalent impedance corresponding to the internal impedance element and the external load impedance.

7. The circuit of claim 6, wherein the current-mode circuitry and voltage-mode circuitry both include the internal impedance element and the switch.

8. The circuit of claim 7, wherein the signal detector is configured to detect a presence of the low frequency signal, and the signal detector being in the first state corresponds to a reduced bias current for at least one of the current-mode amplifier in the current-mode circuitry, a predriver for the current-mode amplifier, or a preemphasis circuit for the current-mode amplifier.

9. A circuit, comprising:
a power supply node;
a first internal circuit node;
a second internal circuit node;
voltage-mode circuitry including a first buffer, a first switch, a second buffer, and a second switch, the first switch being connected between the power supply node and an output node of the first buffer, the second switch being connected between the power supply node and an output node of the second buffer, the voltage-mode circuitry being configurable based in part on a first state of a signal detector to provide a differential low frequency signal conforming to a serial data protocol at the first and second internal circuit nodes via the first and second buffers; and
current-mode circuitry comprising the first and second switches and a differential current-mode amplifier, the current-mode circuitry being configurable based in part on a second state of the signal detector to provide a differential high frequency signal conforming to the serial data protocol to the first and second internal circuit nodes via the differential current-mode amplifier.

10. The circuit of claim 9, wherein each of the first and second buffers comprises a tri-state device:
the tri-state device being configured to cause the corresponding output node of each buffer to follow a corresponding input signal to each buffer in response to an indication that the signal detector is in the first state, the tri-state device also being configured to cause a high impedance at the corresponding output node of each buffer in response to an indication that the signal detector is in the second state.

11. The circuit of claim 9, further comprising:
switch control logic configured to cause the first and second switches to connect the output nodes of the first and second buffers to the power supply node when the signal detector is in the second state such that the voltage-mode circuitry does not degrade signaling bandwidth of the current-mode circuitry.

12. The circuit of claim 9, wherein the serial data protocol corresponds to one of a DisplayPort standard, a Serial ATA standard, a Peripheral Component Interconnect Express (PCI-E) standard, or a Universal Serial Bus (USB) standard.

13. The circuit of claim 9, wherein the differential high frequency signal corresponds to a Universal Serial Bus (USB) SuperSpeed signal or USB SuperspeedPlus signal, and the differential low frequency signal corresponds to a USB differential low frequency periodic signal (LFPS) signal.

14. The circuit of claim 9, further comprising:
a first internal impedance element;
a second internal impedance element;
a current source; and
a transmit port for coupling a first external load impedance and a second external load impedance to the first and second internal circuit nodes;
wherein the current-mode circuitry is configured to drive each end of the differential high frequency signal at the first and second internal circuit nodes based in part on a current magnitude of the current source and a parallel equivalent impedance corresponding to the associated internal impedance element and the associated external load impedance for the particular end of the differential high frequency signal, and wherein
the voltage-mode circuitry is configured to drive each end of the differential low frequency signal at the first and second internal circuit nodes based in part on a voltage magnitude at the associated output node of the associated buffer and a series equivalent impedance corresponding to the associated internal impedance element and the associated external load impedance for the particular end of the differential low frequency signal.

15. The circuit of claim 14, wherein the current-mode circuitry and voltage-mode circuitry both include the first and second internal impedance elements and the first and second switches.

16. The circuit of claim 15, wherein the signal detector is configured to detect a presence of the differential low frequency signal, and the signal detector being in the first state corresponds to a reduced bias current for at least one of the differential current-mode amplifier in the current-mode circuitry, a predriver for the differential current-mode amplifier, or a preemphasis circuit for the differential current-mode amplifier.

17. A circuit, comprising:
a buffer having an output node connected to a power supply node through a switch, the buffer comprising a tri-state device:
the tri-state device being configured to cause the output node of the buffer to follow an input signal to the buffer in response to an indication that a signal detector is in a first state; and
the tri-state device also being configured to cause a high impedance at the output node of the buffer in response to an indication that the signal detector is in a second state;
an internal circuit node;
first circuitry configurable to operate in a voltage mode to transmit a low frequency signal to the internal circuit node via the output node of the buffer, the low frequency signal corresponding to a serial data protocol; and
second circuitry configurable to operate in a current mode to transmit a high frequency signal to the internal circuit node, the high frequency signal corresponding to the serial data protocol.

18. The circuit of claim 17, further comprising:
switch control logic configured to cause the switch to connect the output node of the buffer to the power supply node when the signal detector is in the second state such that the first circuitry does not degrade a signaling bandwidth of the second circuitry.

19. The circuit of claim 17, wherein the serial data protocol corresponds to one of a DisplayPort standard, a Serial ATA standard, a Peripheral Component Interconnect Express (PCI-E) standard, or a Universal Serial Bus (USB) standard.

20. The circuit of claim 17, wherein the high frequency signal corresponds to a Universal Serial Bus (USB) SuperSpeed signal or USB SuperspeedPlus signal, and the low frequency signal corresponds to a USB low-frequency periodic signal (LFPS) signal.

21. The circuit of claim 18, further comprising:
an internal impedance element;
a current source; and
a transmit port for coupling an external load impedance to the internal circuit node;
wherein the second circuitry is configured to drive the high frequency signal at the internal circuit node based in part on a current magnitude of the current source and a parallel equivalent impedance corresponding to the internal impedance element and the external load impedance, and wherein
the first circuitry is configured to drive the low frequency signal at the internal circuit node based in part on a voltage magnitude at the output node of the buffer and a series equivalent impedance corresponding to the internal impedance element and the external load impedance.

22. The circuit of claim 21, wherein the second circuitry and first circuitry both include the internal impedance element and the switch.

23. The circuit of claim 22, wherein the signal detector is configured to detect a presence of the low frequency signal, and the signal detector being in the first state corresponds to a reduced bias current for at least one of a current mode amplifier in the second circuitry, a predriver for the current mode amplifier, or a preemphasis circuit for the current mode amplifier.

* * * * *